United States Patent
Schwarz et al.

(10) Patent No.: US 9,509,117 B2
(45) Date of Patent: Nov. 29, 2016

(54) OPTOELECTRONIC COMPONENT, OPTOELECTRONIC DEVICE AND METHOD OF PRODUCING AN OPTOELECTRONIC DEVICE

(71) Applicant: OSRAM Opto Semiconductors GmbH, Regensburg (DE)

(72) Inventors: Thomas Schwarz, Regensburg (DE); Thomas Dobbertin, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/916,660

(22) PCT Filed: Aug. 14, 2014

(86) PCT No.: PCT/EP2014/067448
§ 371 (c)(1),
(2) Date: Mar. 4, 2016

(87) PCT Pub. No.: WO2015/032603
PCT Pub. Date: Mar. 12, 2015

(65) Prior Publication Data
US 2016/0204574 A1    Jul. 14, 2016

(30) Foreign Application Priority Data

Sep. 5, 2013  (DE) .................. 10 2013 217 796

(51) Int. Cl.
*H01S 5/00*  (2006.01)
*H01S 5/022*  (2006.01)
*H01S 5/40*  (2006.01)

(52) U.S. Cl.
CPC ....... *H01S 5/02272* (2013.01); *H01S 5/02212* (2013.01); *H01S 5/02276* (2013.01); *H01L2224/48091* (2013.01); *H01L 2224/48247* (2013.01);
(Continued)

(58) Field of Classification Search
CPC .......... H01S 5/02272; H01S 5/02276; H01S 5/02212; H01S 5/02236; H01S 5/02256; H01S 5/022
USPC ...................................... 372/44.01
See application file for complete search history.

(56) References Cited

U.S. PATENT DOCUMENTS 6,422,766 B1 * 7/2002 Althaus ............... G02B 6/4208
                                                                    385/92
2005/0047730 A1 * 3/2005 Ellison ................ G02B 6/4201
                                                                    385/92

(Continued)

FOREIGN PATENT DOCUMENTS

CN      101272035       9/2008
DE      198 23 691 A1   12/1999
(Continued)

OTHER PUBLICATIONS

English translation of the Chinese Official Action dated Apr. 18, 2016, of corresponding Chinese Application No. 103129785.

*Primary Examiner* — Kinam Park
(74) *Attorney, Agent, or Firm* — DLA Piper LLP (US)

(57) ABSTRACT

An optoelectronic component includes a housing including a base having an upper side and a lower side, and a cap, and a laser chip arranged between the upper side of the base and the cap, wherein a first solder contact pad and a second solder contact pad are formed on the lower side of the base, the laser chip includes a second electrical contact pad, and the second electrical contact pad electrically conductively connects to a section of the base electrically conductively connected to the second solder contact pad by a second bonding wire.

14 Claims, 5 Drawing Sheets

(52) U.S. Cl.
CPC ............... *H01L 2224/49107* (2013.01); *H01L 2224/49111* (2013.01); *H01S 5/022* (2013.01); *H01S 5/4018* (2013.01); *H01S 5/4031* (2013.01)

(56) References Cited

U.S. PATENT DOCUMENTS

2008/0225920 A1* 9/2008 Nakashima ........... H01S 5/0207
                                                              372/44.01

| | | |
|---|---|---|
| 2012/0033695 A1 | 2/2012 | Hayashi et al. |
| 2012/0287954 A1 | 11/2012 | Saruwatari et al. |
| 2012/0287955 A1 | 11/2012 | Kimura et al. |
| 2013/0022069 A1 | 1/2013 | Lee et al. |

FOREIGN PATENT DOCUMENTS

| | | |
|---|---|---|
| DE | 102 47 315 A1 | 4/2004 |
| JP | 2004-235212 A | 8/2004 |

* cited by examiner

OPTOELECTRONIC COMPONENT, OPTOELECTRONIC DEVICE AND METHOD OF PRODUCING AN OPTOELECTRONIC DEVICE

TECHNICAL FIELD

This disclosure relates to an optoelectronic component, an optoelectronic device, and a method of producing an optoelectronic device.

BACKGROUND

Semiconductor-based laser components including housings in which laser diodes are hermetically sealed for protection from moisture and contamination are known. It is known to equip the housings of such laser components with wire contacts for push-through installation. The wire contacts may be inserted into contact openings of a printed circuit board provided for that purpose and, for example, electrically contacted via wave soldering. It is known to contact the housings of such laser components additionally via mechanical clamping or bonding to dissipate waste heat accumulating during operation of the laser component.

It could nonetheless be helpful to provide an improved optoelectronic component, an optoelectronic device and a method of producing an optoelectronic device.

SUMMARY

We provide an optoelectronic component including a housing including a base having an upper side and a lower side, and a cap, and a laser chip arranged between the upper side of the base and the cap, wherein a first solder contact pad and a second solder contact pad are formed on the lower side of the base, the laser chip includes a second electrical contact pad, and the second electrical contact pad electrically conductively connects to a section of the base electrically conductively connected to the second solder contact pad by a second bonding wire.

We also provide an optoelectronic device including a printed circuit board, and the optoelectronic component wherein the optoelectronic component is arranged on a surface of the printed circuit board.

We further provide a method of producing an optoelectronic device including providing a printed circuit board; providing the optoelectronic component; and arranging the optoelectronic component on a surface of the printed circuit board.

LIST OF REFERENCE NUMERALS

100 Optoelectronic component
110 Housing
200 Base
201 Upper side
202 Lower side
210 First solder contact pad
215 First bonding wire
220 Second solder contact pad
225 Second bonding wire
230 Platform
235 Chip mounting surface
240 Carrier
250 Cavity
260 Electrically conductive pin
265 Insulator
300 Cap
310 Window
320 Weld connection
400 Laser chip
401 Upper side
402 Lower side
410 First electrical contact pad
420 Second electrical contact pad
430 Radiation direction
500 Optoelectronic device
600 Printed circuit board
601 Surface
602 Rear side
610 First mating contact pad (anode)
615 First external contact pad
620 Second mating contact pad (cathode)
625 Second external contact pad
630 Series-circuit string

DETAILED DESCRIPTION

Our optoelectronic component includes a housing comprising a base having an upper side and a lower side, and a cap. In addition, the optoelectronic component includes a laser chip arranged between the upper side of the base and the cap. A first solder contact pad and a second solder contact pad are formed on the lower side of the base. Advantageously, this optoelectronic component is suitable for surface installation. In this case, the first solder contact pad and the second solder contact pad of the optoelectronic component may, for example, be electrically contacted with the aid of reflow soldering. In addition, waste heat may simultaneously be dissipated from the optoelectronic component via the electrically contacted solder contact pads on the lower side of the base of the housing of this optoelectronic component. Advantageously, installation of this optoelectronic component may be automated with little effort, which makes an economical use of the optoelectronic component possible in mass-produced devices.

An electrically conductive pin may extend between the upper side and the lower side through the base. In this case, the pin is electrically insulated from the remaining sections of the base. In addition, the pin electrically conductively connects to the first solder contact pad. Advantageously, the pin thereby makes an electrically conductive connection from the first solder contact pad on the lower side of the base to the upper side of the base. In this case, the pin may, for example, be glazed into the base of the housing of the optoelectronic component.

The laser chip may have a first electrical contact pad. In this case, the first electrical contact pad electrically conductively connects to the pin with the aid of a first bonding wire. The pin and the first bonding wire thereby establish an electrically conductive connection between the first solder contact pad on the lower side of the base of the housing of the optoelectronic component and the first electrical contact pad of the laser chip. As a result, the laser chip of the optoelectronic component may be electrically contacted via the first solder contact pad on the lower side of the base of the housing of the optoelectronic component.

The laser chip may include a second electrical contact pad. In this case, the second electrical contact pad electrically conductively connects to a section of the base that electrically conductively connects to the second solder contact pad with the aid of a second bonding wire. Advantageously, an electrically conductive connection thereby exists via the base and the second bonding wire between the second solder contact pad on the lower side of the base of the housing of the optoelectronic component and the second electrical contact pad of the laser chip of the optoelectronic component. As a result, the laser chip may be electrically contacted via the second solder contact pad.

The second solder contact pad may enclose the first solder contact pad in a ring-like manner. Advantageously, the first solder contact pad and the second solder contact pad may thereby jointly occupy a good portion of the area of the lower side of the base of the housing of the optoelectronic component. As a result, the first solder contact pad and the second solder contact pad jointly form a large thermal contact pad of the optoelectronic component which makes an effective dissipation of waste heat from the optoelectronic component possible.

A platform may be formed on the upper side of the base. In this case, the laser chip is arranged on the platform. The platform may simultaneously be used for the thermal and electrical contacting of the laser chip. Orientation of the laser chip relative to the lower side of the base of the housing of the optoelectronic component may also be determined via the shape of the platform.

The laser chip may be situated such that a radiation direction of the laser chip is oriented perpendicularly to the lower side of the base. Advantageously, this makes an arrangement of the optoelectronic component on a printed circuit board possible such that a radiation direction of the optoelectronic component is oriented perpendicularly to the printed circuit board. This makes an especially space-saving arrangement of the optoelectronic component possible.

The base and/or the cap may include steel. Advantageously, the cap and the base may then be welded to each other in a hermetically sealed manner.

The cap may include a window. The window may, for example, be glazed into the cap. A laser beam emitted by the laser chip of the optoelectronic component may thereby escape from the housing of the optoelectronic component via the window of the cap.

The cap may be welded to the base. Advantageously, the laser chip of the optoelectronic component arranged between the cap and the base is thereby protected from moisture and contamination.

Our optoelectronic device includes a printed circuit board and an optoelectronic component of the aforementioned kind. In this case, the optoelectronic component is arranged on a surface of the printed circuit board. Advantageously, the optoelectronic component may have been arranged and electrically contacted on the surface of the printed circuit board via a method of surface mounting. For example, the optoelectronic component may have been electrically contacted via reflow soldering. This makes an economical production of the optoelectronic device with a high degree of automation possible.

The device may include a plurality of optoelectronic components of the aforementioned kind. In this case, the optoelectronic components are arranged in a series circuit. Advantageously, the optoelectronic device may thereby have high optical output power. Due to the possibility of arranging the optoelectronic components on the surface of the printed circuit board via a method of surface mounting, the individual optoelectronic components may be densely packed on the surface of the printed circuit board. This advantageously makes it possible for the optoelectronic device to have compact exterior dimensions.

One method of producing an optoelectronic device includes the steps of providing a printed circuit board, providing an optoelectronic component of the aforementioned kind, and arranging the optoelectronic component on a surface of the printed circuit board. Advantageously, arrangement of the optoelectronic component on the surface of the printed circuit board may be carried out in an automated manner, for example, with the aid of an SMT placement machine. Arrangement of the optoelectronic component on the surface of the printed circuit board may be carried out in a joint operation with an arrangement of additional components on the surface of the printed circuit board. As a result, the method may be advantageously carried out in an economical manner.

The optoelectronic component may be arranged on the surface of the printed circuit board with the aid of surface mounting.

The optoelectronic component may be arranged on the surface of the printed circuit board with the aid of reflow soldering. In this case, a self-centering of the optoelectronic component may be advantageously carried out. In this case, the optoelectronic component is precisely self-oriented in its target position via surface tension during the melting of solder.

The characteristics, features, and advantages described above, as well as the manner in which they are achieved, will be more clearly and explicitly understandable in connection with the following description of the examples which are explained in greater detail in connection with the drawings.

Figure 1:
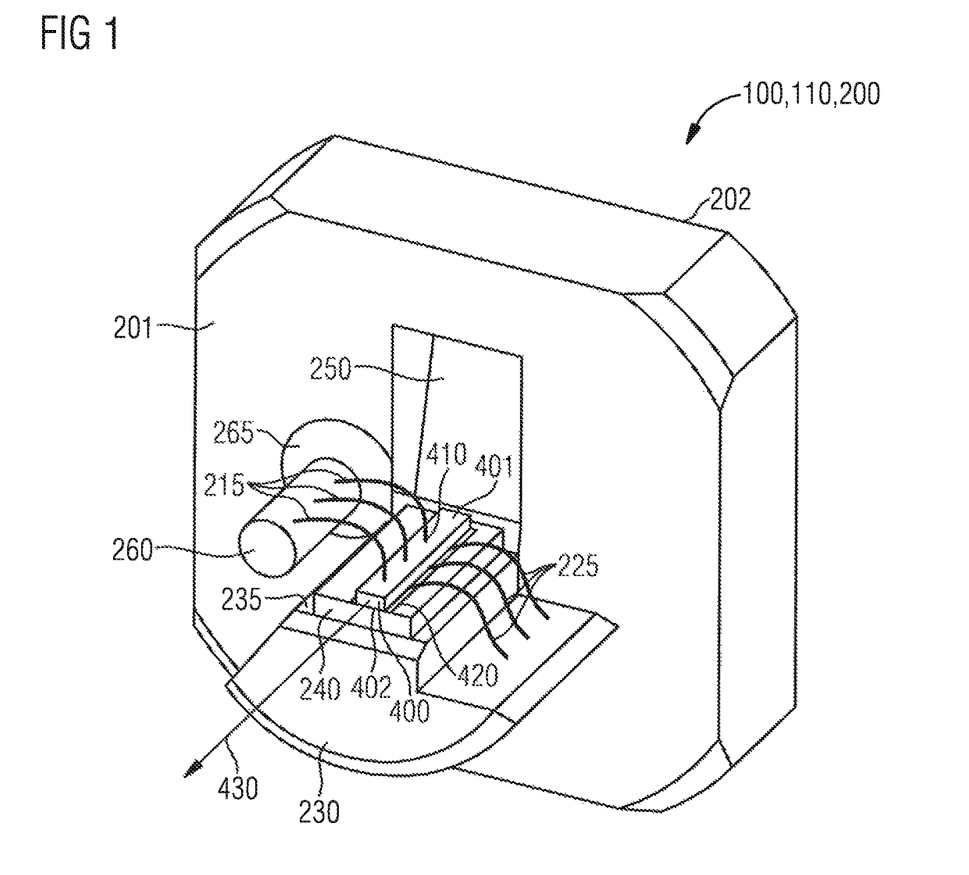
FIG. 1 shows a base of a housing of an optoelectronic component.
Figure 2:
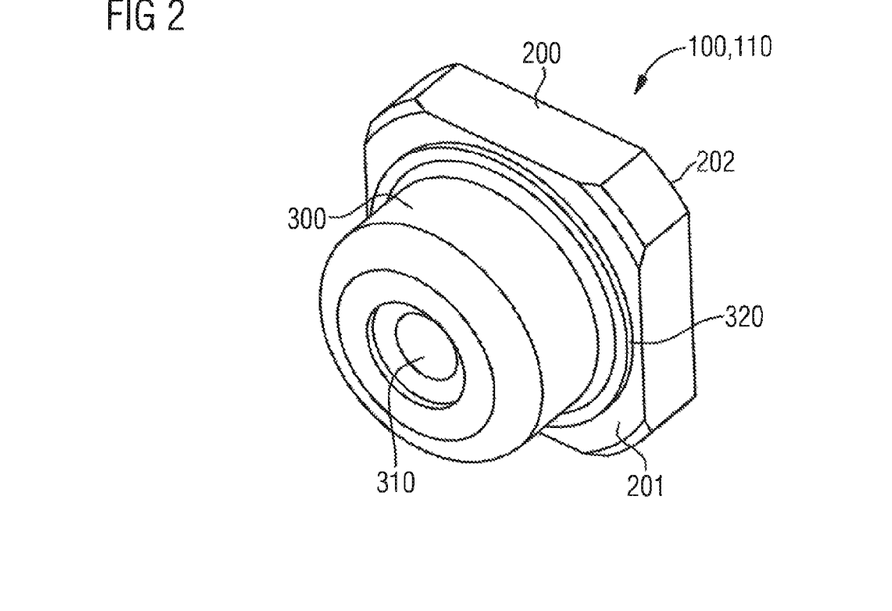
FIG. 2 shows a first view of the housing of the optoelectronic component.
Figure 3:
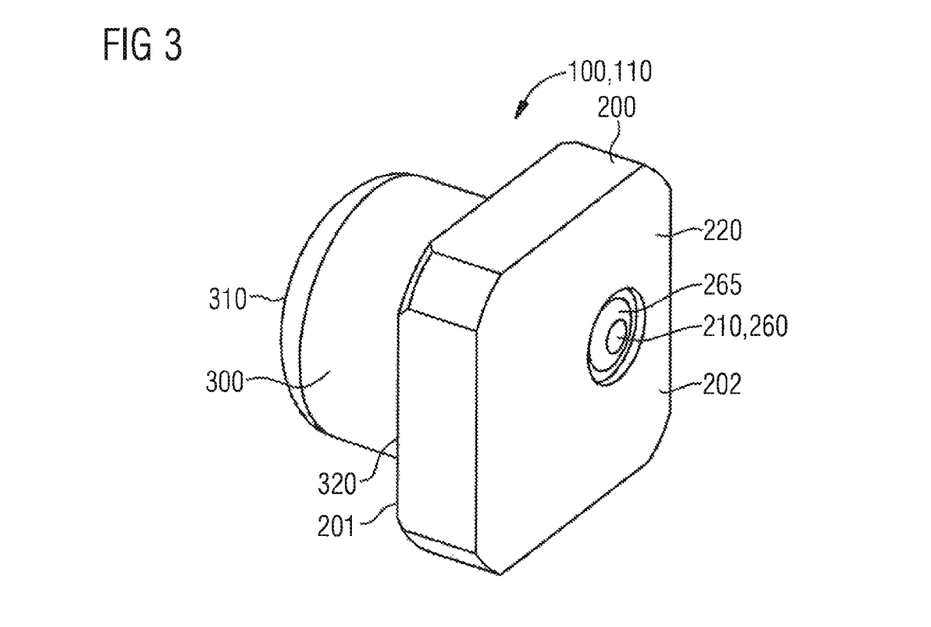
FIG. 3 shows a second view of the housing of the optoelectronic component.

FIG. 1 shows a schematic perspective view of a base 200 of a housing 110 of an optoelectronic component 100. FIG. 2 shows a schematic perspective view of a cap 300 of the housing 110 of the optoelectronic component 100. FIG. 3 shows a schematic perspective view of the housing 110 of the optoelectronic component 100, in which the base 200 and the cap 300 of the housing 110 are joined.

The optoelectronic component 100 may, for example, be a laser component. For example, the optoelectronic component 100 may be a laser component that emits a laser beam having a wavelength in the shortwave visible spectral range.

The base 200 of the housing 110 of the optoelectronic component 100 may also be referred to as the header. The base 200 includes an electrically conductive material, preferably a metal. The base 200 may, for example, include an iron or nickel alloy. For example, the base 200 may include steel.

The base 200 has an upper side 201 and a lower side 202 opposite the upper side 201. In the example shown in FIG. 1, the base 200 has an approximately rectangular basic shape that makes it possible to densely pack the housing 110 of the optoelectronic component 100 including the base 200 next to additional identical housings 110 of additional optoelectronic components 100. However, the base 200 could, for example, also have a circular disk-shaped basic shape or a hexagonal basic shape.

An electrically conductive pin 260 embedded in the base 200 extends from the lower side 202 of the base 200 through the base 200, and beyond the upper side 201 of the base 200. In this case, a portion of the electrically conductive pin 260 projecting beyond the upper side 201 of the base 200 is oriented perpendicularly to the upper side 201 of the base 200. The electrically conductive pin 260 includes an electrically conductive material, for example, a metal. The electrically conductive pin 260 may include the same material as the remaining sections of the base 200.

The electrically conductive pin is electrically insulated from the remaining sections of the base 200 with the aid of an insulator 265. The insulator 265 may, for example, be formed as glazing. Preferably, the electrically conductive pin 260 is embedded in the base 200 in a hermetically sealed manner via the insulator 265.

A platform 230 is formed on the upper side 201 of the base 200 of the housing 110 of the optoelectronic component 100. The platform 230 may also be referred to as a pedestal. The platform 230 may be formed of uniform material integrally connected to the remaining sections of the base 200. In any case, the platform 230 includes an electrically conductive material and electrically conductively connects to those portions of the base 200 which are electrically insulated from the electrically conductive pin 260. The platform 230 has a chip mounting surface 235 preferably oriented approximately perpendicularly to the upper side 201 of the base 200 and thus also perpendicularly to the lower side 202 of the base 200.

The optoelectronic component 100 includes a laser chip 400. The laser chip 400 is a semiconductor-based laser diode. The laser chip 400 emits a laser beam. For example, the laser chip 400 may emit a laser beam having a wavelength in the shortwave visible spectral range, for example, a laser beam having a wavelength in the blue spectral range.

The laser chip 400 has an upper side 401 and a lower side 402 opposite the upper side 401. A first electrical contact pad 410 is formed on the upper side 401 of the laser chip 400. A second electrical contact pad 420 is formed on the lower side 402 of the laser chip 400. During operation of the laser chip 400, an electrical voltage may be applied to the laser chip 400 between the first electrical contact pad 410 and the second electrical contact pad 420 of the laser chip 400.

The laser chip 400 of the optoelectronic component 100 is positioned on the chip mounting surface 235 of the platform 230 of the base 200 of the housing 110 of the optoelectronic component 100 such a way that a radiation direction 430 of the laser chip 400 is oriented approximately perpendicularly to the upper side 201 of the base 200 and thus also perpendicularly to the lower side 202 of the base 200. During operation of the laser chip 400, it radiates a laser beam in the radiation direction 430.

In the example of FIG. 1, the radiation direction 430 of the laser chip 400 is oriented parallel to the upper side 401 of the laser chip 400. The laser chip 400 is an edge emitter. However, it is also possible to design the laser chip 400 as a surface emitter. In this case as well, the laser chip 400 should be positioned on the platform 230 of the base 200 of the housing 110 of the optoelectronic component 100 such that the radiation direction 430 of the laser chip 400 is oriented perpendicularly to the upper side 201 and thus also perpendicularly to the lower side 202 of the base 200. The platform 230 may then optionally be omitted.

The laser chip 400 is arranged on a carrier 240. The carrier 240 may also be referred to as a submount. The carrier 240 preferably includes an electrically insulating and thermally highly conductive material. An electrically conductive metalization is arranged on an upper side of the carrier 240. The laser chip 400 is arranged on the upper side of the carrier 240 such that the lower side 402 of the laser chip 400 faces the upper side of the carrier 240. In this case, the second electrical contact pad 420 of the laser chip 400 formed on the lower side 402 of the laser chip 400 makes an electrically conductive connection with the electrically conductive metalization on the upper side of the carrier 240.

The carrier 240 is arranged on the chip mounting surface 235 of the platform 230 of the base 200 such that a lower side of the carrier 240 opposite the upper side of the carrier 240 faces the chip mounting surface 235. In this case, a thermally highly conductive connection preferably exists between the carrier 240 and the platform 230.

The first electrical contact pad 410 of the laser chip 400 formed on the upper side 401 of the laser chip 400 electrically conductively connects to the electrically conductive pin 260 with the aid of a plurality of first bonding wires 215. The electrically conductive metalization on the upper side of the carrier 240 electrically conductively connects to the platform 230 of the base 200 and thus also electrically conductively connects to those sections of the base 200 that are electrically insulated from the electrically conductive pin 260, with the aid of a plurality of second bonding wires 225. Since the metalization formed on the upper side of the carrier 240 electrically conductively connects to the second electrical contact pad 420 on the lower side 402 of the laser chip 400, an electrically conductive connection thus exists between the second electrical contact pad 420 of the laser chip 400 and the sections of the base 200 that are electrically insulated from the electrically conductive pin 260.

It is also possible to form the carrier 240 from electrically conductive material. In this case, an electrically conductive metalization on the upper side of the carrier 240 may be omitted. The laser chip 400 is arranged on the upper side of the carrier 240 such that the second electrical contact pad 420 formed on the lower side 402 of the laser chip 400 electrically conductively connects to the carrier 240. The carrier 240 is situated on the chip mounting surface 235 of the platform 230 such that the carrier 240 electrically conductively connects to the platform 230. In this case, the second bonding wires 225 may be omitted.

It is also possible to completely omit the carrier 240. In this case, the laser chip 400 is situated directly on the chip mounting surface 235 of the platform 230 such that the lower side 402 of the laser chip 400 faces the chip mounting surface 235, and the second electrical contact pad 420 formed on the lower side 402 of the laser chip 400 makes an electrically conductive connection with the platform 230. In this case as well, the second bonding wires 225 may be omitted.

A cavity 250 is arranged on the upper side 201 of the base 200. The cavity 250 is formed as a recess in the upper side 201 of the base 200. The cavity 250 may be used to accommodate a photodiode. The photodiode may be provided to detect laser light emitted by the laser chip 400. However, the photodiode may also be omitted. The cavity 250 may then also be omitted.

In FIG. 3, the lower side 202 of the base 200 of the housing 110 of the optoelectronic component 100 is visible. The lower side 202 of the base 200 is essentially flat. A first solder contact pad 210 and a second solder contact pad 220 are formed on the lower side 202 of the base 200. The first solder contact pad 210 and the second solder contact pad 220 are arranged in a common plane. The first solder contact pad 210 is formed on the longitudinal end of the electrically conductive pin 260 and electrically conductively connected to it. The second solder contact pad 220 encloses the first solder contact pad 210 in a ring-like manner and electrically conductively connects to those sections of the base 200 that are electrically insulated from the electrically conductive pin 260.

The first solder contact pad 210 and the second solder contact pad 220 of the base 200 of the housing 110 of the optoelectronic component 100 are suitable for surface mounting, for example, surface mounting via reflow soldering.

The cap 300 of the housing 110 of the optoelectronic component 100 may be made, for example, from a deep-drawn steel sheet.

The cap 300 is designed to be arranged on the upper side 201 of the base 200 of the housing 110 of the optoelectronic component 100 such that the platform 230 and the laser chip 400 arranged on the chip mounting surface 235 of the platform 230 may be covered by the cap 300. Preferably, the laser chip 400 is sealed off from the surroundings of the housing 110 of the optoelectronic component 100 in a hermetically sealed manner. The laser chip 400 is thereby protected from moisture and contamination. As a result, a service life of the laser chip 400 and thus a service life of the overall optoelectronic component 100 may increase.

The cap 300 may be connected to the base 200 of the housing 110 with the aid of a weld connection 320. The weld connection 320 between the cap 300 and the base 200 of the housing 110 of the optoelectronic component 100 may, for example, be established via pulse welding. The cap 300 may have an annular edge on its side facing the upper side 201 of the base 200, which is melted during the production of the weld connection 320.

The cap 300 has a window 310 arranged such that a laser beam emitted by the laser chip 400 of the optoelectronic component 100 may escape from the housing 110 of the optoelectronic component 100 through the window 310 if the laser chip 400 is covered by the cap 300. For this purpose, the window 310 includes a material essentially transparent to laser radiation emitted by the laser chip 400. Preferably, the window 310 is glazed into the cap 300 in a hermetically sealed manner.

Figure 4:
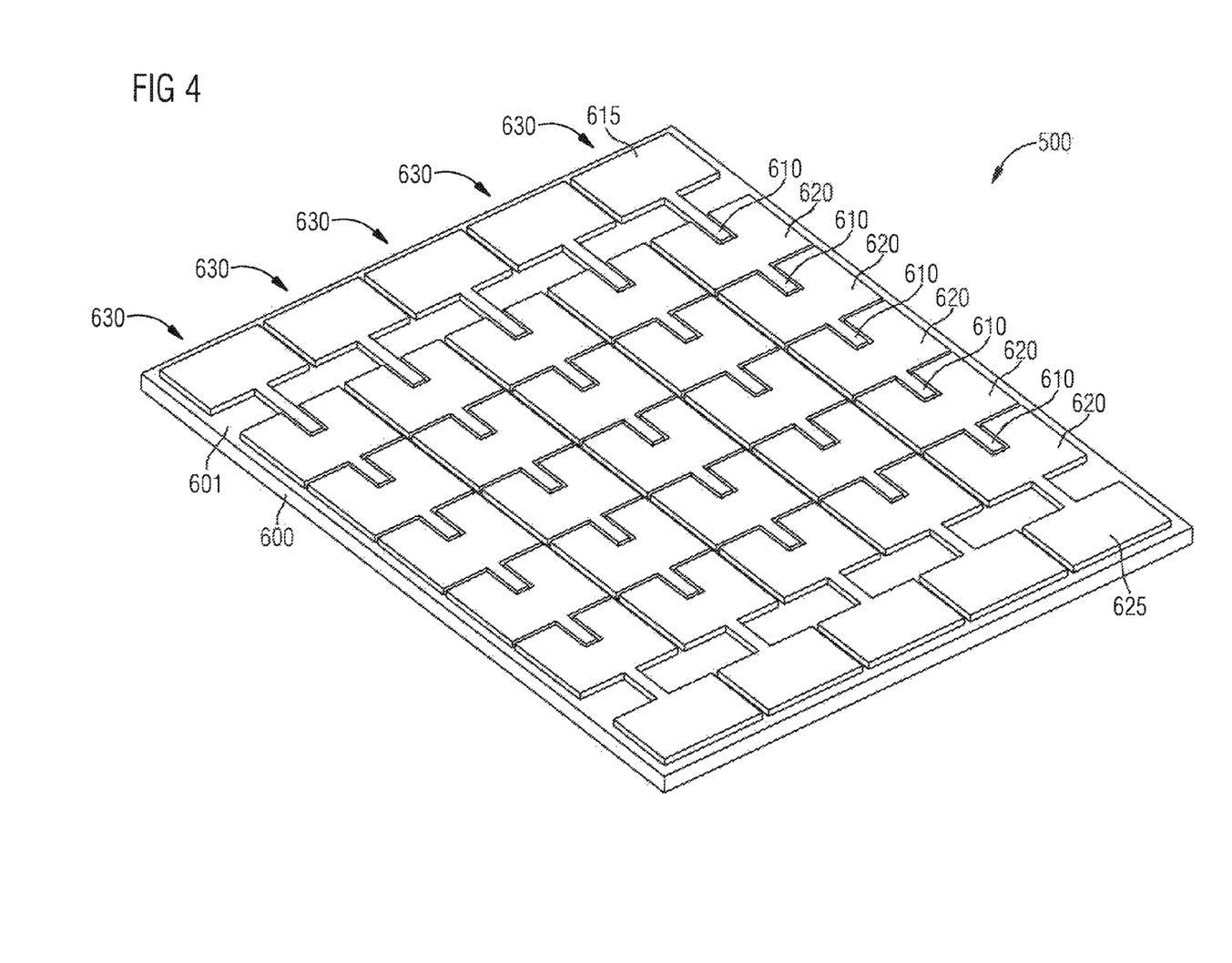
FIG. 4 shows a printed circuit board of an optoelectronic device.

FIG. 4 shows a schematic perspective view of a printed circuit board 600 of an optoelectronic device 500. The optoelectronic device 500 may, for example, be a laser device.

The printed circuit board 600 has a surface 601 and a rear side 602 opposite the surface 601. In the example shown in FIG. 4, the printed circuit board 600 is designed as a DCB (direct copper bonding) printed circuit board and includes a layer composite made up of copper, an insulator, and an additional layer of copper. The insulator may, for example, include aluminum oxide or aluminum nitride. However, the printed circuit board 600 can also be an FR4 printed circuit board having integrated thermal vias or a metal-core printed circuit board.

In the example depicted in FIG. 4, five series-circuit strings 630 are arranged on the surface 601 of the printed circuit board 600, each being provided to accommodate five optoelectronic components 100. Of course, the printed circuit board 600 can also include a different number of series-circuit strings 630. The series-circuit strings 630 can also accommodate fewer or more than five optoelectronic components 100 each.

Each series-circuit string 630 has a plurality of first mating contact pads 610 and second mating contact pads 620 formed in a metalization on the surface 601 of the printed circuit board 600. Each second mating contact pad 620 of a series-circuit string 630, up to the last second mating contact pad 620 of each series-circuit string 630, is formed as one piece integrally connected to a subsequent first mating contact pad 610 of the same series-circuit string 630. Conversely, each first mating contact pad 610 of a series-circuit string 630, up to the first mating contact pad 610 of each series-circuit string 630, also integrally connects as one piece to each preceding second mating contact pad 620 of the same series-circuit string 630. The first mating contact pad 610 of each series-circuit string 630 electrically conductively connects to a first outer connecting area 615 of each series-circuit string 630. The last second mating contact pad 620 of each series-circuit string 630 electrically conductively connects to a second outer connecting area 625 of each series-circuit string 630.

Figure 5:
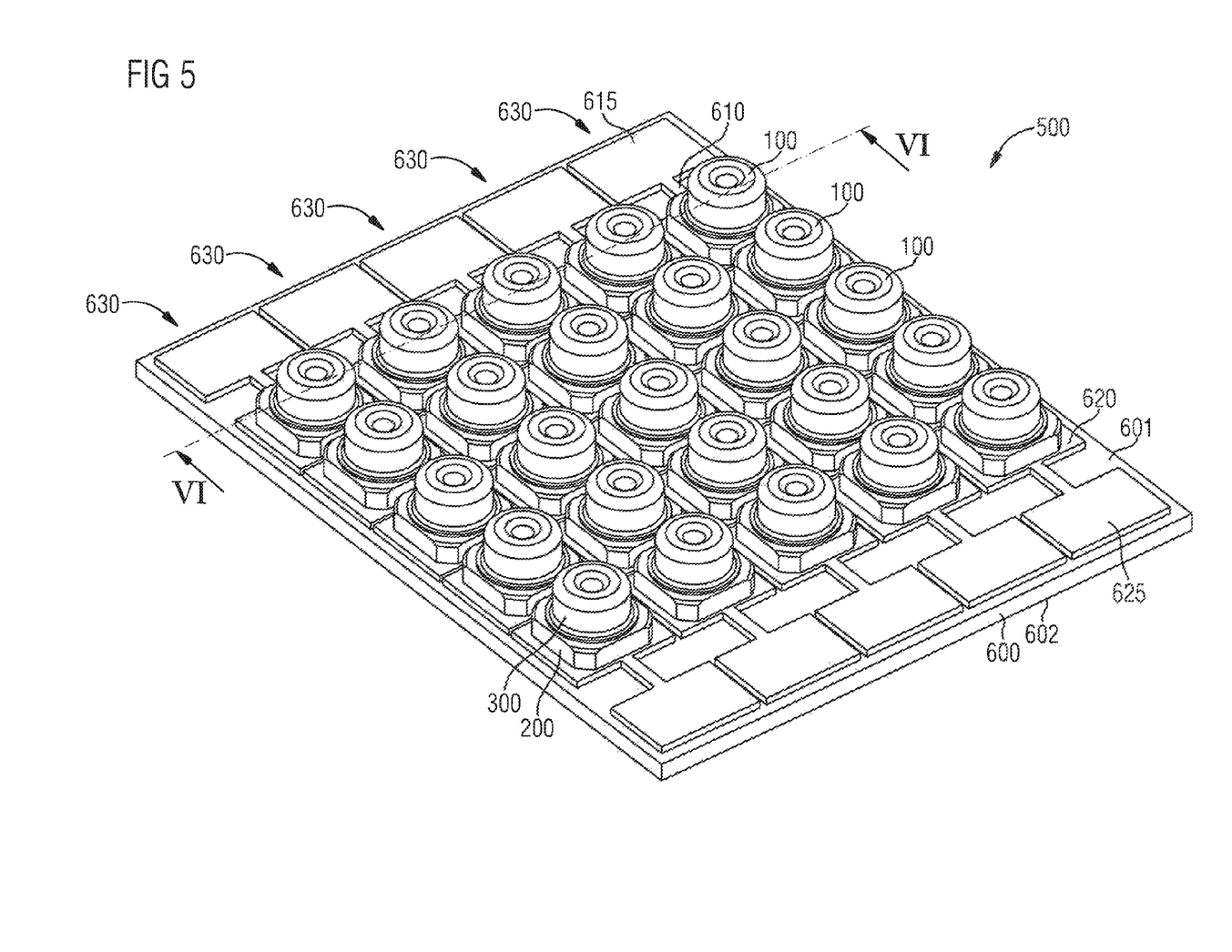
FIG. 5 shows the printed circuit board including optoelectronic components which are arranged on it.
Figure 6:
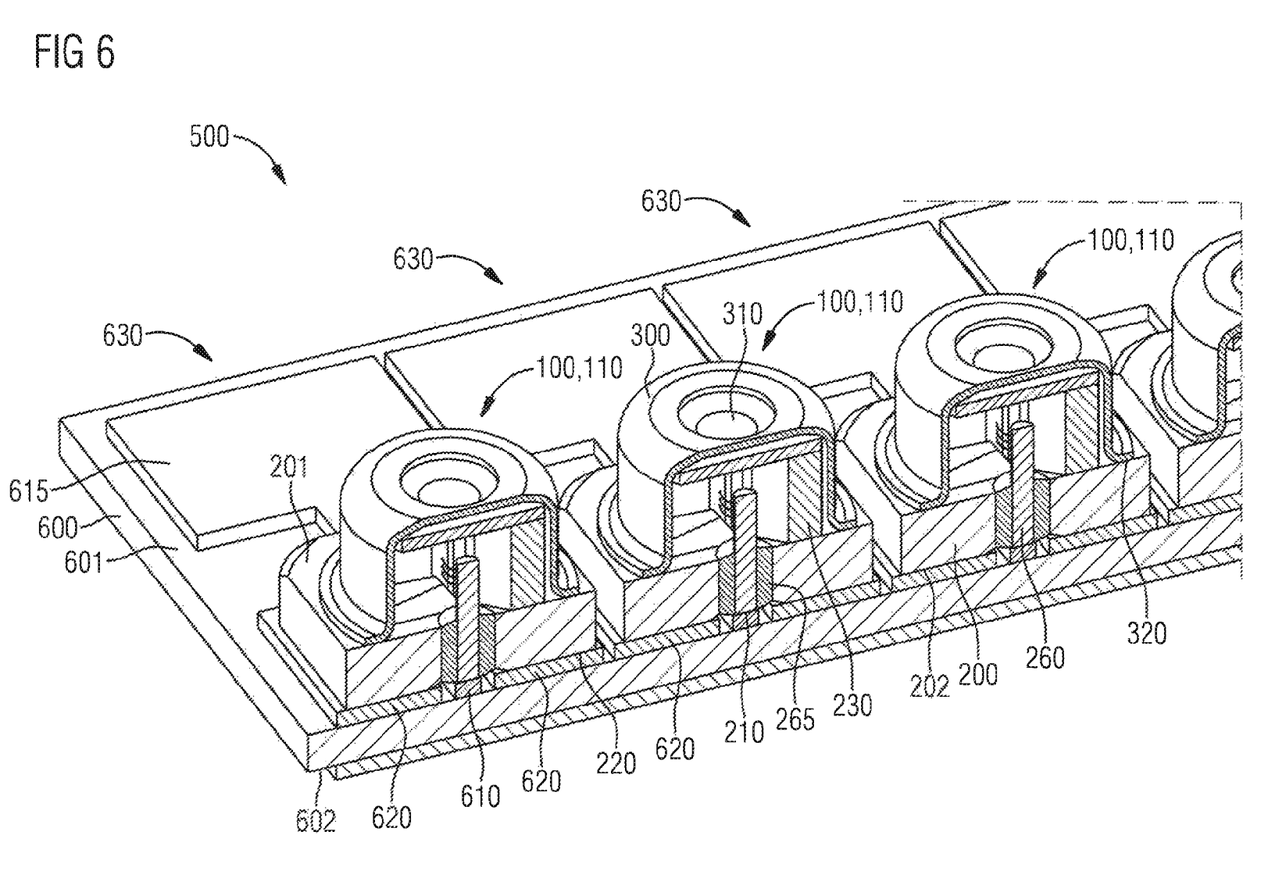
FIG. 6 shows a cross-sectional view of the printed circuit board and the optoelectronic components of the optoelectronic device.

FIG. 5 shows a schematic perspective view of the printed circuit board 600 of the optoelectronic device 500 including optoelectronic components 100 arranged on it. FIG. 6 shows a schematic cut-away view of a portion of the printed circuit board 600 and the optoelectronic components 100 of the optoelectronic device 500.

Five optoelectronic components 100 are arranged on each of the five series-circuit strings 630 of the printed circuit board 600. In this case, each optoelectronic component 100 is arranged such that the lower side 202 of the base 200 of the housing 110 of each optoelectronic component 100 faces the surface 601 of the printed circuit board 600 of the optoelectronic device 500. The first solder contact pad 210 on the lower side 202 of the base 200 of the housing 110 of each optoelectronic component 100 electrically conductively contacts a first mating contact pad 610 of the printed circuit board 600. The second solder contact pad 220 on the lower side 202 of the base 200 of the housing 110 of each optoelectronic component 100 electrically conductively connects to a second mating contact pad 620 on the surface 601 of the printed circuit board 600. As a result, the optoelectronic components 100 of each series-circuit string 630 electrically connect in series.

The optoelectronic components 100 have been arranged on the surface 601 of the printed circuit board 600 via a method of surface mounting. For example, the optoelectronic components 100 may have been arranged on the surface 601 of the printed circuit board 600 via reflow soldering.

Electrically conductive solder is arranged between the first solder contact pad 210 of each optoelectronic component 100 and the associated first mating contact pad 610 of the printed circuit board 600. Correspondingly, solder is also arranged between the second solder contact pad 220 of each optoelectronic component 100 and the associated second mating contact pad 620 of the printed circuit board 600.

A solder resist is arranged in the transition areas between the second mating contact pads 620 and each of the subsequent first mating contact pads 610 of each series-circuit string 630 of the printed circuit board 600, as well as in the transition area between the first outer connecting area 615 and the subsequent first mating contact pad 610 of each series-circuit string 630, which solder resist electrically insulates each section of the first mating contact pad 610 from the second solder contact pad 220 of each associated optoelectronic component 100.

To install the optoelectronic components 100 on the surface 601 of the printed circuit board 600 of the optoelectronic device 500, solder paste is first arranged on the mating contact pads 610, 620 on the surface 601 of the printed circuit board 600. The solder paste comprises solder balls, flux, and solvent. Simultaneously, solder resist is provided at the aforementioned areas of the first mating contact pads 610. The arrangement of the solder paste and the solder resist may, for example, be carried out via screen or stencil printing. The solder resist may also already be applied during production of the printed circuit board and may be structured via photopatterning. Subsequently, the optoelectronic components 100 are arranged on the surface 601 of the printed circuit board 600. This may, for example, be carried out with the aid of an SMT placement machine. Subsequently, the optoelectronic components 100 are soldered on in a reflow oven or vapor phase oven. Subsequently, the optoelectronic device 500 may be washed to remove excess flux.

Simultaneously with the arrangement of the optoelectronic components 100 on the surface 601 of the printed circuit board 600, other components may be arranged on the surface 601 of the printed circuit board 600 and electrically conductively connected to it.

In each series-circuit string 630 of the optoelectronic device 500, an electrical voltage may be applied between the first outer connecting area 615 and the second outer connecting area 625 to operate the optoelectronic components 100 of each series-circuit string 630.

During operation of the optoelectronic device 500, waste heat accumulates in the laser chips 400 of the optoelectronic components 100. The waste heat accumulating in the laser chips 400 at each optoelectronic component 100 may dissipate into the base 200 of each optoelectronic component 100 via the lower side 402 of the laser chip 400 and the carrier 240. The waste heat may dissipate from the base 200 into the printed circuit board 600, via the first solder contact pad 210 and the second solder contact pad 220 on the lower side 202 of the base 200 of each optoelectronic component 100, the solder connections between the solder contact pads 210, 220 and the mating contact pads 610, 620 of the printed circuit board 600, and the mating contact pads 610, 620 of the printed circuit board 600. In this case, dissipation of the waste heat arising in the optoelectronic components 100 is supported via the extensive contact between the lower side 202 of the base 200 of each optoelectronic component 100 and the surface 601 of the printed circuit board 600. The solder connections between the solder contact pads 210, 220 of the optoelectronic components 100 and the mating contact pads 610, 620 of the printed circuit board 600 advantageously have only a slight thermal resistance.

Our components, devices and methods have been illustrated and described in greater detail based on preferred examples. However, this disclosure is not limited to the examples. Rather, other variations may be derived from them by those skilled in the art without departing from the scope of protection of the appended claims.

The application claims priority of DE 10 2013 217 796.8, the subject matter of which is incorporated herein by reference.

The invention claimed is:

1. An optoelectronic component comprising:
a housing comprising a base having an upper side and a lower side, and a cap, and
a laser chip arranged between the upper side of the base and the cap,
wherein a first solder contact pad and a second solder contact pad are formed on the lower side of the base,
the laser chip includes a second electrical contact pad, and
the second electrical contact pad electrically conductively connects to a section of the base electrically conductively connected to the second solder contact pad by a second bonding wire.

2. The optoelectronic component as claimed in claim 1, wherein an electrically conductive pin extends between the upper side and the lower side through the base,
the pin is electrically insulated from the remaining sections of the base, and
the pin electrically conductively connects to the first solder contact pad.

3. The optoelectronic component as claimed in claim 2, wherein the laser chip includes a first electrical contact pad, and
the first electrical contact pad electrically conductively connects to the pin with the aid of a first bonding wire.

4. The optoelectronic component as claimed in claim 1, wherein the second solder contact pad encloses the first solder contact pad in a ring shape.

5. The optoelectronic component as claimed in claim 1, wherein a platform is formed on the upper side of the base, and
the laser chip is arranged on the platform.

6. The optoelectronic component as claimed in claim 1, wherein the laser chip is arranged such that a radiation direction of the laser chip is oriented perpendicularly to the lower side of the base.

7. The optoelectronic component as claimed in claim 1, wherein the base and/or the cap include(s) steel.

8. The optoelectronic component as claimed in claim 1, wherein the cap includes a window.

9. The optoelectronic component as claimed in claim 1, wherein the cap is welded to the base.

10. An optoelectronic device comprising:
a printed circuit board, and
the optoelectronic component as claimed in claim 1,
wherein the optoelectronic component is arranged on a surface of the printed circuit board.

11. The optoelectronic device as claimed in claim 10, wherein the optoelectronic device includes a plurality of optoelectronic components comprising:
a housing comprising a base having an upper side and a lower side, and a cap, and
a laser chip arranged between the upper side of the base and the cap,
wherein a first solder contact pad and a second solder contact pad are formed on the lower side of the base,
the laser chip includes a second electrical contact pad,
the second electrical contact pad electrically conductively connects to a section of the base electrically conductively connected to the second solder contact pad by a second bonding wire, and
the optoelectronic components are arranged in a series circuit.

12. A method of producing an optoelectronic device comprising:
providing a printed circuit board;
providing the optoelectronic component as claimed in claim 1; and
arranging the optoelectronic component on a surface of the printed circuit board.

13. The method as claimed in claim 12, wherein the optoelectronic component is arranged on the surface of the printed circuit board by surface mounting.

14. The method as claimed in claim 13, wherein the optoelectronic component is arranged on the surface of the printed circuit board by reflow soldering.

* * * * *